(12) United States Patent
Reykowski et al.

(10) Patent No.: US 11,921,177 B2
(45) Date of Patent: Mar. 5, 2024

(54) MAGNETIC FIELD ($B_O$) ARTIFACT REDUCTION THROUGHT ACTIVE SHIMMING

(71) Applicant: KONINKLIJKE PHILIPS N.V., Eindhoven (NL)

(72) Inventors: Arne Reykowski, Newberry, FL (US); Alton Keel, Gainesville, FL (US); Timothy Ortiz, Alachua, FL (US); Scott King, Gainesville, FL (US); Rodrigo Calderon Rico, Newberry, FL (US); Paul Franz Redder, Newberry, FL (US)

(73) Assignee: Koninklijke Philips N.V., Eindhoven (NL)

( * ) Notice: Subject to any disclaimer, the term of this patent is extended or adjusted under 35 U.S.C. 154(b) by 16 days.

(21) Appl. No.: 17/773,852

(22) PCT Filed: Oct. 27, 2020

(86) PCT No.: PCT/EP2020/080139
§ 371 (c)(1),
(2) Date: May 3, 2022

(87) PCT Pub. No.: WO2021/089366
PCT Pub. Date: May 14, 2021

(65) Prior Publication Data
US 2022/0397620 A1 Dec. 15, 2022

Related U.S. Application Data

(60) Provisional application No. 62/930,108, filed on Nov. 4, 2019.

(51) Int. Cl.
*G01R 33/3875* (2006.01)
*G01R 33/389* (2006.01)

(52) U.S. Cl.
CPC ....... *G01R 33/3875* (2013.01); *G01R 33/389* (2013.01)

(58) Field of Classification Search
CPC .......................... G01R 33/3875; G01R 33/389
See application file for complete search history.

(56) References Cited

U.S. PATENT DOCUMENTS

| | | | |
|---|---|---|---|
| 5,726,571 A | 3/1998 | Guclu et al. | |
| 7,525,314 B1* | 4/2009 | Heiland | H01J 37/02 324/318 |

(Continued)

FOREIGN PATENT DOCUMENTS

| | | |
|---|---|---|
| JP | 2008078529 A | 4/2008 |
| WO | 9613735 A1 | 5/1996 |

OTHER PUBLICATIONS

Ahn et al "Field Mapping and Automated Shimming of an HTS Magnet by "Internal" Active Shim Coils Located in the Bore of the Magnet" IEEE Transactions on Applied Superconductivity, vol. 25, No. Jun. 3, 2015.

(Continued)

*Primary Examiner* — Daniel R Miller

(57) ABSTRACT

An electronic device (10) includes an electronic component (14); at least one electrically conductive loop or winding (18) disposed around the electronic component; and an electronic controller (24) configured to: obtain (102) a magnetic field direction from a received ambient magnetic field measurement signal; determine (104) at least one magnetic field shim current based on the obtained magnetic field direction; and energize (106) the at least one electrically conductive loop or winding to flow the determined at least one magnetic field shim current.

20 Claims, 3 Drawing Sheets

(56) References Cited

U.S. PATENT DOCUMENTS

| | | |
|---|---|---|
| 2007/0170917 A1 | 7/2007 | Thompson et al. |
| 2007/0233195 A1* | 10/2007 | Wahlstrand ....... H01M 10/0525 |
| | | 607/2 |
| 2007/0279060 A1 | 12/2007 | Dannels et al. |
| 2008/0027666 A1 | 1/2008 | Schenkel et al. |
| 2009/0099025 A1* | 4/2009 | Uchaykin ................ H05K 3/24 |
| | | 29/829 |
| 2009/0168286 A1* | 7/2009 | Berkley ............... H05K 9/0077 |
| | | 361/141 |
| 2011/0316535 A1 | 12/2011 | Price et al. |
| 2014/0084926 A1* | 3/2014 | Amthor .................. G01R 33/56 |
| | | 324/309 |
| 2015/0102809 A1 | 4/2015 | Van Beek et al. |
| 2017/0248665 A1 | 8/2017 | Ludwig et al. |

OTHER PUBLICATIONS

International Search Report and Written Opinion from PCT/EP2020/080139 dated Jan. 27, 2021.

\* cited by examiner

MAGNETIC FIELD ($B_O$) ARTIFACT REDUCTION THROUGHT ACTIVE SHIMMING

CROSS REFERENCE TO RELATED APPLICATIONS

This application is a U.S. national phase application of International Application No. PCT/EP2020/080139 filed on Oct. 27, 2020, which claims the benefit of U.S. Application Ser. No. 62/930,108 filed Nov. 4, 2019 and is incorporated herein by reference.

FIELD

The following relates generally to the imaging arts, magnetic resonance imaging arts, magnetic resonance image quality arts, magnetic field shim current arts, and related arts.

BACKGROUND

Magnetic resonance imaging (MRI) scanners are increasingly employing electronic components inside the magnet bore. These components use integrated circuit (IC) chips, such as field programmable gate arrays (FPGAs), application-specific integrated circuits (ASICs), microprocessors, memory chips, System-on-Chip (SoC) chips, System-in-Package (SiP) chips, and so forth. These IC chips include magnetic material, such as nickel used as a diffusion barrier in gold plating for wire bond bumps and flip-chip bond bumps, along with packaging or shielding materials. Replacement with a nonmagnetic material is typically either impossible or would require purchasing custom-made IC chips, which may not be cost-effective. The magnetic material of the IC chip locally distorts the static ($B_0$) magnetic field, which can lead to imaging artifacts. As these can be large chips (e.g., an FPGA may be 1.7 cm×1.7 cm square) the amount of image distortion introduced by the IC chip can be significant.

Electronic components inside the magnet bore also require electric power. Power cables can couple to magnetic field gradients and/or radio frequency (RF) signals, and cable routing issues can also arise. Battery power is an appealing alternative approach. However, batteries also commonly include magnetic material which can introduce image distortion.

The following discloses certain improvements to overcome these problems and others.

SUMMARY

In one aspect, an electronic device includes an electronic component; at least one electrically conductive loop or winding disposed around the electronic component; and an electronic controller configured to: obtain a magnetic field direction from a received ambient magnetic field measurement signal; determine at least one magnetic field shim current based on the obtained magnetic field direction; and energize the at least one electrically conductive loop or winding to flow the determined at least one magnetic field shim current.

In another aspect, an electronic device includes an IC chip; a magnetic field sensor configured to measure an ambient magnetic field measurement signal; a plurality of electrically conductive loops or windings disposed around the IC chip; and an electronic controller configured to: obtain a magnetic field direction from the ambient magnetic field measurement signal measured by the magnetic field sensor; determine at least one magnetic field shim current based on the obtained magnetic field direction; and energize the plurality of electrically conductive loops or windings to flow the determined at least one magnetic field shim current.

In another aspect, a method for determining magnetic field shim currents includes: obtaining a magnetic field direction from a received ambient magnetic field measurement signal; determining at least one magnetic field shim current based on the obtained magnetic field direction; and energizing the at least one electrically conductive loop or winding to flow the determined at least one magnetic field shim current.

One advantage resides removing artifacts in images caused by one or more magnetic components.

Another advantage resides in generating active shimming currents to cancel magnetic artifacts in images.

Another advantage resides in generating an equal but opposing magnetization to cancel magnetic artifacts in images.

Another advantage resides in hiding the effects of magnetic components on images by generating corresponding shimming currents.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The disclosure may take form in various components and arrangements of components, and in various steps and arrangements of steps. The drawings are only for purposes of illustrating the preferred embodiments and are not to be construed as limiting the disclosure.

DETAILED DESCRIPTION

Figure 1:
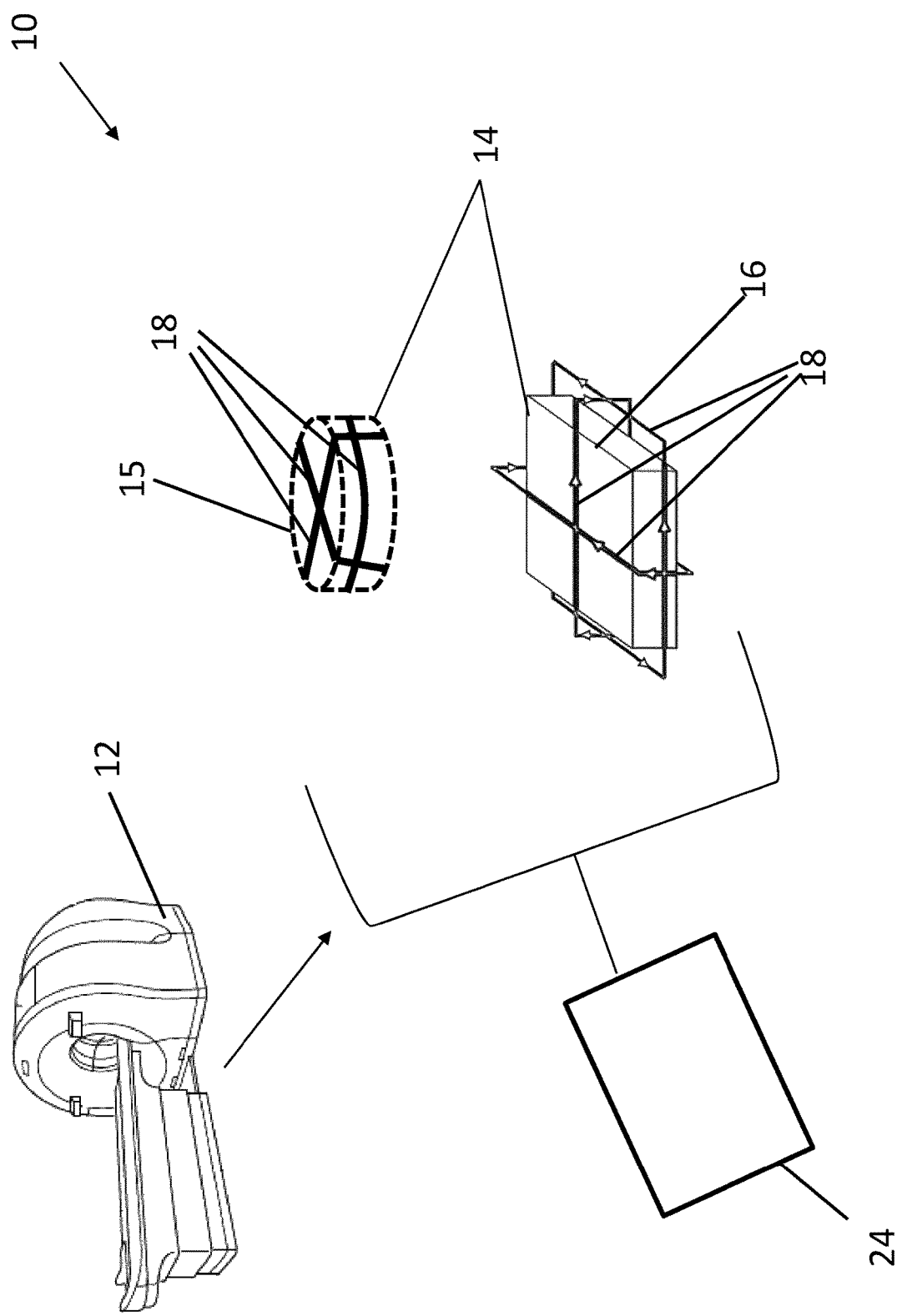
FIG. 1 illustrates an exemplary embodiment of an electronic device for a MRI system in accordance with one aspect.

The systems and methods disclosed herein leverage the observation that the effect of the IC chip (or other magnetic object) in the $B_0$ field can be modeled as a bound electric current flowing on the surface of the IC chip which generates a concentrated magnetic moment M. In one example embodiment, conductive wires or loops are wrapped around the outside of the IC chip, and electric current is flowed in these conductors to cancel the magnetic moment M.

In some embodiments disclosed herein, the ambient magnetic field (that is, the magnetic field within which the IC chip is embedded) is measured using a three-axis Hall sensor or other magnetic field sensor mounted on or with the magnetic object which is capable of measuring the magnetic field in three-dimensions (3D). However, to remove image artifacts it is not appropriate to simply null the measured magnetic field. The goal is not to remove the magnetic field, but rather to restore $B_0$ to its undistorted value. The distorting magnetic moment M introduced by magnetic material in the IC chip is typically small compared with the magnitude of the $B_0$ field, i.e. $|M|\ll|B_0|$. Moreover, both $B_0$ and M are vectors, which may be oriented in different directions. Hence, it is difficult to determine the magnetic moment M vector that is to be removed via the magnetic field measurement.

To remedy these issues, in some embodiments disclosed herein electric currents applied by the conductive wires or loops to compensate for the $B_0$ distortion are pre-calibrated for various spatial orientations of the IC chip respective to the $B_0$ vector using simulations or experiments. For example, the IC chip can be placed in the bore in a given orientation, images are acquired, and the compensation loop currents adjusted until image artifacts are minimized. A similar approach could be done using an electromagnetic simulator, where the goal is to adjust the compensation loop currents until the distortion is removed. This calibration is done at a number of different orientations.

Thereafter, the IC chip is deployed in conjunction with a 3D Hall sensor. The Hall sensor is only used to determine the orientation of the IC chip respective to the $B_0$ field; the applied compensation loop currents are those of the calibration for that orientation. (Interpolation can be employed if there are a few different discrete orientation calibrations).

Advantageously, the Hall sensor does not need to be mounted on, or even proximate to, the IC chip. Rather, the Hall sensor must only be mounted with a fixed orientation respective to the IC chip. Usually it will be simplest to mount the Hall sensor on the same PCB on which the IC chip is mounted. Furthermore, since the magnetic field measurement is used only to determine the direction of the $B_0$ field, any magnetic field distortion at the Hall sensor due to the magnetic moment M produced by the IC chip (if it is close to the Hall sensor) will usually have negligible impact on the determined direction of $B_0$ due to the difference in magnitudes, i.e. $|B_0|\gg|M|$.

In some embodiments disclosed herein, the IC chip is a programmable IC chip such as an FPGA or microprocessor. The controller for driving the loop compensation currents can be implemented on the IC chip itself in these cases. The conductive loops can be added to an off-the-shelf IC chip as they are external to the IC chip. Still further, the compensation loop currents are DC currents that can, in some embodiments, be drawn from the digital power rails (e.g., $V_{CC}$-GND potential difference). Hence, all the IC chips on a board can be made effectively "self-cloaking" with respect to distorting the $B_0$ field by adding the requisite on-board control program and surrounding conductive loops, and a single 3D Hall sensor (or other 3D magnetic field sensor) mounted on the board.

The proposed design is also readily deployed in MRI scanners employing different $B_0$ strength. In this case, in addition to determining the $B_0$ orientation the Hall sensor also determines its magnitude $|B_0|$. It is expected that the calibration compensation loop currents should scale linearly with $|B_0|$. Alternatively, the calibration of the compensating electric currents can be done for several different standard field strengths (e.g. 1.5 Tesla, 3.0 Tesla).

In some embodiments disclosed herein, the compensation loop currents can be turned off when the device is not performing imaging, to save power.

In some embodiments disclosed herein, the disclosed approach can be used to compensate for magnetic field gradients by way of measuring the ambient magnetic field magnitude in real time and compensating for the change in magnitude as a function of time. A further contemplated variant entails measuring the derivative, $d|B_0|/dt$, which should be proportional to induced eddy currents in the ground plane of the PCB. The experimental or simulation calibration would in this case be performed for the IC chip on the PCB, and the eddy current compensation as a function of $d|B_0|/dt$ is calibrated by applying different magnetic field cycling patterns that are expected to be encountered during MRI imaging.

In other embodiments disclosed herein, the disclosed approach can be used to compensate for magnetic field gradients caused by effects of a magnetic component moving in time. Such movements cause a spatial gradient $dB/dx(t)$ of the magnetic moment M to change over time, which induces varying fields in the IC chip.

While the illustrative embodiments provide artifact reduction for IC chips, the disclosed approaches are also applicable to other devices placed inside the MRI bore that contain magnetic material, such as on-board batteries, large capacitors or inductors, shielding and/or packaging materials, or the like.

As used herein, the term "ambient magnetic field" (and variants thereof) refer to a magnetic field in a surrounding area or environment surrounding a circuit on which an electronic component is mounted. Said another way, the ambient magnetic field is the magnetic field in which the circuit is embedded. In the context of MRI, the ambient magnetic field is typically the static $B_0$ magnetic field generated by a (typically superconducting) magnet disposed in an MRI scanner, or the $B_0$ field modified by magnetic field gradients superimposed by magnetic field gradient coils of the MRI scanner. It is noted that, as used herein, the "ambient magnetic field" does not typically refer to the magnetic field of the Earth. Any impact of the Earth's magnetic field on the ambient magnetic field inside an MRI bore is completely negligible, e.g. the Earth's magnetic field at the surface is typically around 25-65 microTesla; whereas, some standard $B_0$ magnetic field values for some commercial MRI scanners are 0.23 Tesla, 1.5 Tesla, 3.0 Tesla, or even higher.

As used herein, an electrically conductive loop (and variants thereof) is a single conductor turn; while, an electrically conductive winding (and variants thereof) comprises two or more conductor turns whose induced magnetic fields additively combine, e.g. a solenoid (although more generally, the two or more conductor turns do not have to be of the same radius as is usually the case in a solenoid).

FIG. 1 illustrates one exemplary embodiment of an electronic device 10 for an associated medical imaging device (e.g., an MRI scanner) 12. The electronic device 10 includes an electronic component 14. In some embodiments, the electronic component 14 can be a battery 15, such as an illustrative flat cylindrical button battery. In other embodiments, the electronic component 14 can be an IC chip 16, such as an FPGA, microprocessor chip, or so forth.

The electronic device 10 also include at least one electrically conductive loop or winding 18 disposed around the electronic component 14. The at least one electrically conductive loop or winding 18 is configured to flow a magnetic field shim current. As shown in FIG. 1, the at least one electrically conductive loop or winding 18 comprises three electrically conductive loops or windings 18 disposed around the electronic component 14; however, any suitable number of loops or windings may be used. The three loops 18 shown in FIG. 1 have mutually orthogonal loops normal (e.g., the respective normal vectors to the respective planes in which the respective loops are disposed are mutually orthogonal). Such an arrangement of three mutually orthogonal loops enables compensation regardless of the orientation of the electronic device 10 respective to the direction of the ambient magnetic field. However, it is contemplated to employ fewer than three loops—for example, if it the approximate orientation of the electronic device respective to the $B_0$ magnetic field is known a priori then only two, or perhaps even only one, conductive loop may be sufficient. As an example of such a situation, a head coil designed to be deployed in connection with a patient lying prone or supine may have an approximately pre-defined orientation respective to $B_0$, and hence an IC chip mounted on that head coil may also have an approximately pre-defined orientation respective to $B_0$.

Figure 2:
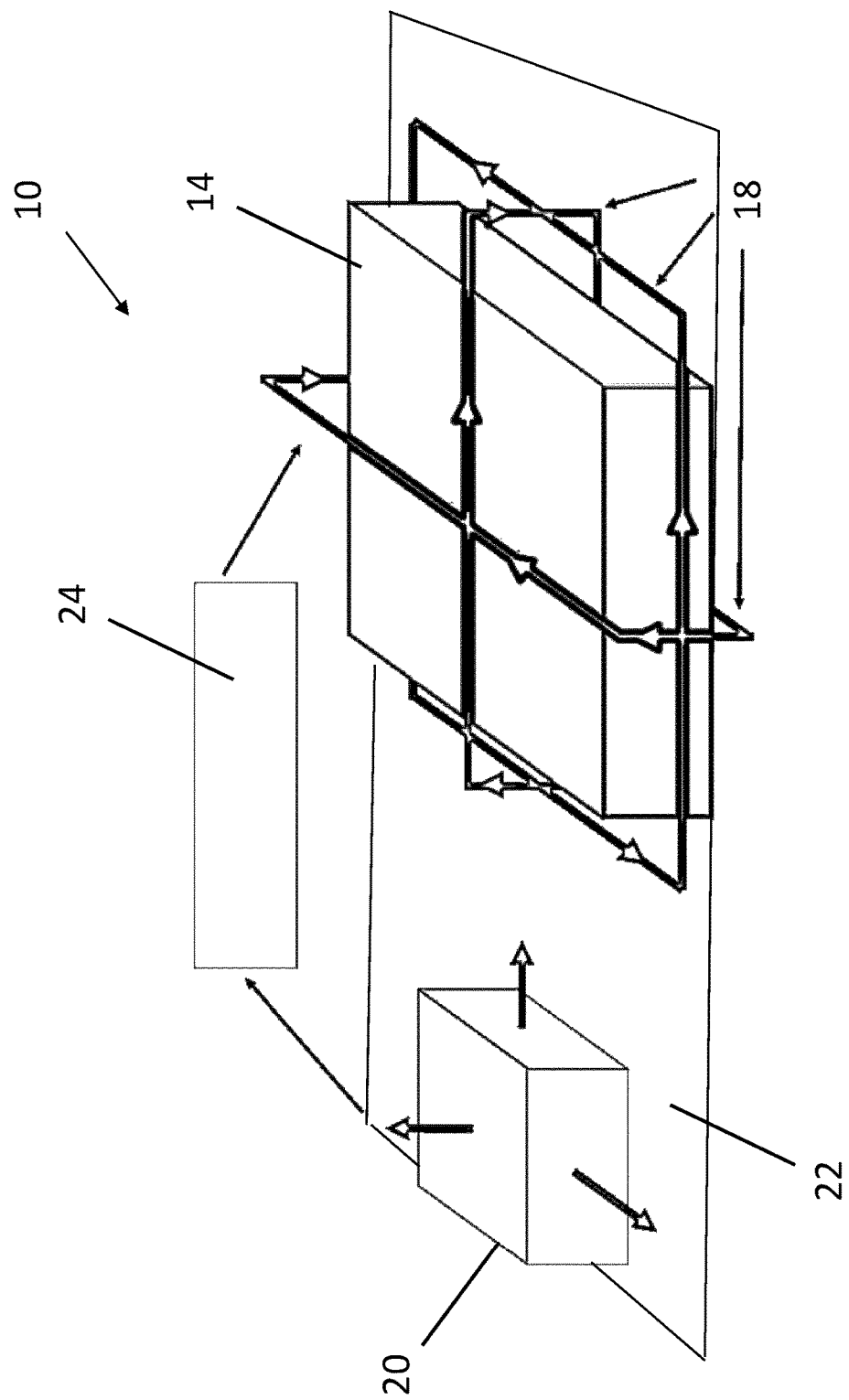
FIG. 2 illustrates another exemplary embodiment of an electronic device for a MRI system in accordance with one aspect.

With continuing reference to FIG. 1 and with reference to FIG. 2, the electronic device 10 also includes a magnetic field sensor 20 configured to generate an ambient field signal that is indicative of the magnitude and direction (in 3D) of the ambient magnetic field. In some examples, the magnetic field sensor 20 comprises a 3-axis Hall effect sensor, although other types of magnetometers are contemplated as the magnetic field sensor 20, such as a magneto-resistive sensor, a fluxgate magnetometer, or so forth. The electronic device 10 also includes (or, viewed alternatively, is disposed on) a printed circuit board (PCB) 22 upon which the electronic component 14 is mounted. As shown in FIG. 2, the electronic component 14 and the magnetic field sensor 20 are mounted on the (same) PCB 22, while three conductive loops 18 encircle the electronic component. However, in some embodiments, the magnetic field sensor 20 does not need to be mounted on the PCB 22, but must only be mounted with a fixed orientation respective to the electronic component 14. (This fixed orientation is achieved when the electronic component 14 and the magnetic field sensor 20 are mounted on the same PCB 22, assuming the PCB 22 is not a flexible PCB).

The electronic device 10 also includes an electronic controller 24 (also referred to as a processor or control unit) configured to determine and deliver a shimming current to each of the electrically conductive loops or windings 18. The electronic controller is electrically connected with the at least one electrically conductive loop or winding 18, and, in some embodiments, to the magnetic field sensor 20.

The electrically conductive loop(s) or winding(s) 18 can be fabricated in various ways. In one approach, the electrically conductive loop or winding 18 comprises one or more turns of wire wrapped around the electronic component 14. This approach is convenient for retroactively adding the electrically conductive loop(s) or winding(s) 18 to an off-the-shelf electronic component. In another approach, the electrically conductive loop or winding 18 comprises an electrical trace or set of traces deposited on a housing of the electronic component 14, e.g. using vacuum evaporation or the like, with suitable masking during evaporation or use of photolithography to delineate the electrical trace(s). In another approach, one electrically conductive loop or winding 18 is formed as an electrical PCB trace of the PCB 22 arranged to encircle the place where the electronic component 14 is mounted onto the PCB 22. (This approach will generally work only for an electrically conductive loop or winding 18 whose plane is parallel with the plane of the PCB 22). In another approach, one electrically conductive loop or winding 18 is formed as an electrical trace fabricated on a silicon wafer of the IC chip during fabrication of the IC chip 14. (This assumes the electronic component 14 is an IC chip, and will generally work only for an electrically conductive loop or winding 18 whose plane is parallel with the plane of the silicon wafer, and cannot be employed for retrofitting an off-the-shelf IC chip.) In yet another approach, the electronic component 14 can be housed in an external housing (not shown) that includes the electrically conductive loop(s) or winding(s) 18. This approach may be suitable, for example, in the case of the battery 15 of FIG. 1, where the housing may be a battery housing or receptacle into which the battery 15 is installed. In this way, an off-the-shelf battery can be used. These are merely some non-limiting illustrative approaches for providing the electrically conductive loop(s) or winding(s) 18.

Each electrically conductive loop or winding 18 should be arranged relative to the electronic component 14 so that the induced magnetic field which is generated by an electric current flowing through the electrically conductive loop or winding 18 passes through the electronic component 14. This is readily achieved if the electrically conductive loop or winding 18 is wrapped around the electronic component 14. However, it can be achieved in other ways. For example, in the embodiment previously mentioned in which an electrically conductive loop or winding 18 is formed as a conductive PCB trace on the PCB 22 encircling the mounting location of the electronic component 14, the plane of the electrically conductive PCB trace is spatially offset from the electronic component 14, but the magnetic field generated by a current flowing through the encircling PCB trace will still pass through the electronic component 14. In general, it is desirable for the electrically conductive loop(s) or winding(s) 18 to wrap around the electronic component 14 or otherwise be tightly coupled thereto; hence, while in the example of FIG. 2 a PCB trace encircling the outer perimeter of the PCB 22 will generate a magnetic field that passes through the electronic component 14, only a small portion of that field will actually pass through the electronic component making the distortion compensation highly inefficient.

Operative electrical connection of the electronic controller 24 to the electrically conductive loop(s) or winding(s) 18 can be done in various ways. If the electronic controller 24 is mounted on the PCB 22, then electrically conductive PCB traces of the PCB 22 can be provided (during fabrication of the PCB 22) to connect wire bond or surface mount contact pads of the electronic controller 24 to bond pads to which an electrically conductive loop or winding 18 is soldered. In embodiments in which the electronic controller 24 is integrally implemented on the IC chip 14, e.g. by suitable controller programming implemented in the IC chip 14 comprising an FPGA or microprocessor, then surface mount pads (not shown) of the IC chip 14 to which the IC chip is programmed to direct the drive electric current are connected with the electrically conductive loop or winding 18. In embodiments in which the digital power rails (e.g., $V_{CC}$-GND potential difference) provide electrical power for driving the electrically conductive loop(s) or winding(s) 18, there is no need for any additional electrical power supply for driving providing the drive electrical power for the electrically conductive loop(s) or winding(s) 18. As the magnetization M due to magnetic material in an IC chip or other mostly non-magnetic component is expected to be small, the digital power rails are expected to be sufficient in many specific applications. If additional power is needed, then a separate power source is supplied, in which case the operative electrical connection of the electronic controller 24 to the electrically conductive loop(s) or winding(s) 18 may suitably be by way of power control circuitry controlling the amount of power delivered to the electrically conductive loop(s) or winding(s) 18, with the electronic controller 24 controlling the power control circuitry. Again, these are some nonlimiting illustrative examples.

Figure 3:
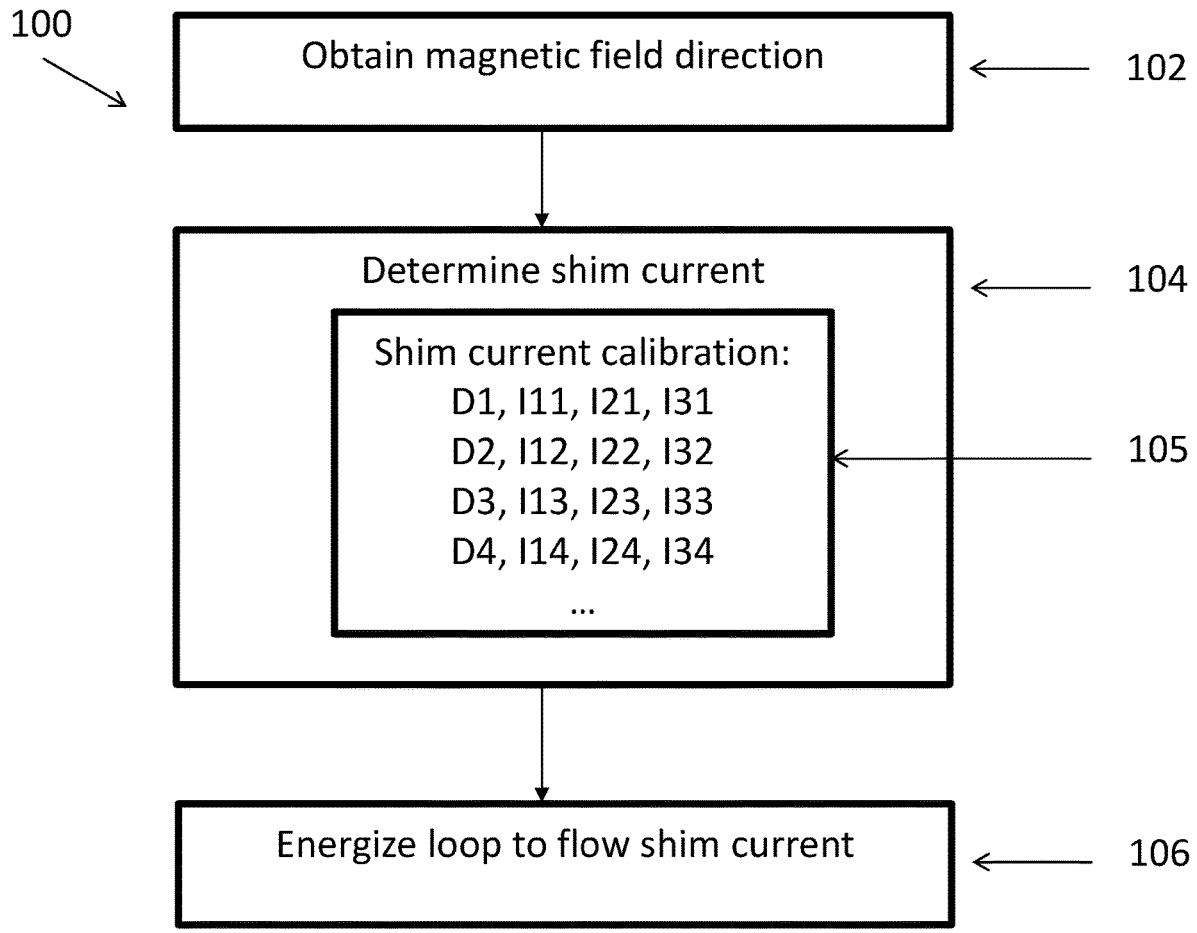
FIG. 3 shows exemplary flow chart operations of the devices of FIGS. 1 and 2.

With continuing reference to FIGS. 1 and 2, and with further reference to FIG. 3, the electronic controller 24 is configured to perform a method or process 100 for determining magnetic field shim currents. To do so, the electronic processor 24 is configured to: obtain 102 a magnetic field direction from a received ambient magnetic field measurement signal; determine 104 at least one magnetic field shim current based on the obtained magnetic field direction; and energize 106 the at least one electrically conductive loop or winding 18 to flow the determined at least one magnetic field shim current.

In some embodiments, the obtaining operation 102 includes measuring or determining the magnetic field direction with the magnetic field sensor 20. In other embodiments, the obtaining operation 102 includes measuring or determining a magnetic field strength of the ambient magnetic field with the magnetic field sensor 20. In this example, the determining operation 104 includes using the magnetic field direction (and optionally the magnetic field strength) to determine the at least one magnetic field shim current. If the magnitude of the ambient magnetic field is known a priori (e.g. the electronic device 10 is to be used with a standard 3 Tesla magnet), then the only variable is the orientation of the $B_0$ field. A suitable shim currents calibration 105 is shown in FIG. 3, where each row of the calibration table stores a tuplet of the form:

(DX,I1X,I2X,I3X)

where "DX" denotes the orientation of the (ambient) $B_0$ magnetic field and I1X, I2X, I3X denote the shim currents appropriate for orientation "DX" for each of the (illustrative) three electrically conductive loops or windings 18. If the measured $B_0$ orientation is not precisely aligned with any table entry then the closest entry can be selected, or interpolation between two closest entries can be performed. If the ambient magnetic field strength is not known a priori, then this can be obtained from the magnetic field measurement and the shim currents calibration can be modified to:

(DX,MY,I1XY,I2XY,I3XY)

where "MY" denotes the ambient magnetic field strength, and the appropriate shim current for each loop or winding is parameterized by both direction (X) and magnitude (Y). As previously noted, the shim currents calibration 105 is suitably generated offline either experimentally (e.g., by placing the device in an MRI at various orientations and, for each orientation adjusting the shim currents until the image distortion is minimized) or by simulations (by simulating the same in an electromagnetic simulator). In further embodiments, the obtaining operation 102 includes determining a time derivative of the magnetic field strength of the ambient field, and using this time derivative (along with the direction) to determine the at least one magnetic field shim current at the operation 104. The time derivative of the magnetic field induces eddy currents in a ground plane of the PCB 22 which in turn induce magnetic moments that distort the image, and these are shimmed.

In yet other embodiments, the energizing operation 106 includes energizing the at least one electrically conductive loop or winding 18 only when the MRI scanner 12 is acquiring imaging data. This entails providing the electronic controller 24 with information about when imaging is being performed. This information may be provided, for example, by an MRI imaging controller (not shown) of the MRI scanner 12. In another approach, the detection of a time-varying magnetic field by the magnetic field sensor 20 provides an indication of when imaging is being performed. When not imaging, there should be no magnetic field gradients being applied and so the ambient magnetic field should be static; by contrast, during imaging the applied magnetic field gradients will dynamically vary the ambient magnetic field, and this can be detected by the magnetic field sensor 20 to determine when imaging is being performed. Since some portions of the magnetic resonance imaging sequence may not involve magnetic field gradients, the approach preferably turns on the shim currents as soon as a dynamically changing ambient magnetic field is detected, and turns them off only after some time interval after the ambient magnetic field becomes static (e.g., wait one or two seconds after the field becomes static before turning off the shim currents).

In some embodiments, the IC chip 14 comprises an electronic processor or control unit, such as a microprocessor, a microcontroller, or a FPGA. For example, the IC chip itself 14 is programmed to perform the obtaining operation 102, the determining operation 104, and the energizing operation 106. In this embodiment, the microprocessor or microcontroller or FPGA 14 does not receive electrical power other than via power supply pins of the microprocessor or microcontroller or FPGA that supply operational power for the microprocessor or microcontroller or FPGA.

The at least magnetic field shim currents are DC currents that can, in some embodiments, be drawn from the digital power rails (e.g., $V_{CC}$-GND potential difference). Hence, all the electronic components 14 mounted on the PCB 22 can be made effectively "self-cloaking" with respect to distorting the ambient magnetic field by adding the requisite on-board control program and surrounding conductive loops, and a single magnetic field sensor 20 mounted on the PCB 22.

In other embodiments, the electronic component 14 includes a plurality of electronic components (e.g., a plurality of batteries, a plurality of IC chips, a combination of one or more batteries and one or more IC chips, and so forth) that are each mounted on the PCB 22. Each electronic component 14 has a corresponding at least one electrically conductive loop or winding 18 disposed thereabout. The electronic controller 24 is configured to perform the obtaining operation 102, the determining operation 104, and the energizing operation 106 for each electronic component 14.

In determining the at least one magnetic shim current at operation 104, the value of the at least one magnetic shim current should restore the ambient magnetic field to an undistorted value, rather than removing the ambient magnetic field. However, it is not apparent what such an undistorted value would be from the measurement by the magnetic field sensor 20.

To resolve this, the electronic device 10 can be calibrated for various orientations of the electronic component 14 relative to the ambient magnetic field (e.g., by placing the electronic component in a bore of the MRI scanner 12, acquiring images, and adjusting currents of the at least one electrically conductive loop or winding 18 until the artifacts or minimized or eliminated). Thereafter, when the magnetic field sensor 20 determines the orientation of the device respective to the ambient magnetic field; the applied compensation loop currents are those of the calibration for that orientation.

The disclosure has been described with reference to the preferred embodiments. Modifications and alterations may occur to others upon reading and understanding the preceding detailed description. It is intended that the exemplary embodiment be construed as including all such modifications and alterations insofar as they come within the scope of the appended claims or the equivalents thereof.

The invention claimed is:

1. An electronic device, comprising:
an electronic component;
at least one electrically conductive loop or winding)-disposed around the electronic component; and
an electronic controller configured to:
determine an orientation of the electronic component with respect to a direction of an ambient magnetic field, from a received ambient magnetic field measurement signal;
determine at least one magnetic field shim current based on the determined orientation of the electronic component with respect to the direction of the ambient magnetic field, and a calibration table which maps various orientations of the electronic component with respect to the direction of the ambient magnetic field, to corresponding magnetic field shim currents; and
energize the at least one electrically conductive loop or winding to flow the determined at least one magnetic field shim current.

2. The electronic device of claim 1, wherein the electronic component is an integrated circuit (IC) chip.

3. The electronic device of claim 2, wherein:
the IC chip is a microprocessor or a microcontroller or a Field Programmable Gate Array (FPGA); and
the electronic controller comprises the microprocessor or microcontroller or FPGA and is programmed to:
determine the orientation of the electronic component with respect to the direction of the ambient magnetic field from the received ambient magnetic field measurement signal;
determine the at least one magnetic field shim current based on the determined orientation of the electronic component with respect to the direction of the ambient magnetic field, and the calibration table; and
energize the at least one electrically conductive loop or winding to flow the determined at least one magnetic field shim current.

4. The electronic device of claim 3, wherein the microprocessor or microcontroller or FPGA does not receive electrical power other than via power supply pins of the microprocessor or microcontroller or FPGA that supply operational power for the microprocessor or microcontroller or FPGA.

5. The electronic device of claim 1, wherein the electronic component is a battery.

6. The electronic device of claim 1, wherein the at least one electrically conductive loop or winding disposed around the electronic component consists of three electrically conductive loops or windings having mutually orthogonal loop normals.

7. The electronic device of claim 1, further comprising:
a printed circuit board (PCB) on which the electronic component is mounted; and
a magnetic field sensor mounted on the PCB, the magnetic field sensor generating the ambient magnetic field measurement signal that is received at the electronic controller.

8. The electronic device of claim 7, wherein the magnetic field sensor comprises a Hall effect sensor.

9. The electronic device of claim 7, wherein:
the electronic component comprises a plurality of electronic components each mounted on the PCB and each having at least one electrically conductive loop or winding disposed around the electronic component; and
the electronic controller is configured to, for each of the electronic components:
determine an orientation of the electronic component with respect to the direction of the ambient magnetic field from the ambient magnetic field measurement signal received from the magnetic field sensor;
determine at least one magnetic field shim current for the electronic component based on the determined orientation of the electronic component with respect to the direction of the ambient magnetic field, and a calibration table for the electronic component which maps various orientations of the electronic component with respect to the direction of the ambient magnetic field, to corresponding magnetic field shim currents; and
energize the at least one electrically conductive loop or winding of each electronic component of the plurality of electronic components to flow the determined at least one magnetic field shim current for that electronic component.

10. The electronic device of claim 7, wherein the at least one electrically conductive loop or winding includes an electrically conductive loop or winding comprising a printed circuit of the PCB, wherein the printed circuit encircles the electronic component mounted on the PCB.

11. The electronic device of claim 1, wherein the electronic controller is configured to energize the at least one electrically conductive loop or winding to flow the determined at least one magnetic field shim current only when an associated magnetic resonance imaging (MRI) scanner is acquiring imaging data.

12. The electronic device of claim 1, wherein the electronic controller is further configured to:
obtain a field strength of the ambient magnetic field from the received ambient magnetic field measurement signal; and
determine the at least one magnetic field shim current based on the determined orientation of the electronic component with respect to the direction of an ambient magnetic field, and the calibration table, and the obtained magnetic field strength.

13. An electronic device, comprising:
an integrated circuit (IC) chip;
a magnetic field sensor configured to measure an ambient magnetic field measurement signal;
a plurality of electrically conductive loops or windings disposed around the IC chip; and
an electronic controller configured to:
determine an orientation of the electronic component with respect to a direction of an ambient magnetic field from the ambient magnetic field measurement signal measured by the magnetic field sensor;
determine at least one magnetic field shim current based on the determined orientation of the electronic component with respect to the direction of the ambient magnetic field, and a calibration table which maps various orientations of the electronic component with respect to the direction of the ambient magnetic field, to corresponding magnetic field shim currents; and
energize the plurality of electrically conductive loops or windings to flow the determined at least one magnetic field shim current.

14. The electronic device of claim 13, wherein:
the IC chip is a microprocessor or a microcontroller or a Field Programmable Gate Array (FPGA) programmed to perform the determining and energizing operations.

15. The electronic device of claim 13, further comprising:
a printed circuit board (PCB) on which at least one of the IC chip and the magnetic field sensor is mounted.

16. The electronic device of claim 15, wherein the plurality of electrically conductive loops or windings comprises a printed circuit of the PCB, wherein the printed circuit encircles the IC chip.

17. The electronic device of claim 13, wherein the magnetic field sensor comprises a Hall effect sensor.

18. The electronic device of claim 14, wherein the electronic controller is further configured to:
   obtain a magnetic field strength from the ambient magnetic field measurement signal measured by the magnetic field sensor; and
   determine the at least one magnetic field shim current based on the determined orientation of the electronic component with respect to the direction of the ambient magnetic field, and the calibration table, and the obtained magnetic field strength.

19. The electronic device of claim 14, wherein the electronic controller is further configured to:
   obtain a time derivative of the magnetic field strength from the ambient magnetic field measurement signal measured by the magnetic field sensor; and
   determine the at least one magnetic field shim current based on the determined orientation of the electronic component with respect to the direction of an ambient magnetic field, and the calibration table, and the obtained time derivative of the magnetic field strength.

20. A method, comprising:
determining an orientation of an electronic component with respect to a direction of an ambient magnetic field from a received ambient magnetic field measurement signal;
determining at least one magnetic field shim current based on the determined orientation of the electronic component with respect to the direction of the ambient magnetic field, and a calibration table which maps various orientations of the electronic component with respect to the direction of the ambient magnetic field, to corresponding magnetic field shim currents; and
energizing at least one electrically conductive loop or winding which is disposed around the electronic component to flow the determined at least one magnetic field shim current.

* * * * *